United States Patent
Chen

(10) Patent No.: US 8,357,570 B2
(45) Date of Patent: Jan. 22, 2013

(54) PIXEL STRUCTURE AND METHOD FOR FABRICATING THE SAME

(75) Inventor: Yu-Cheng Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 177 days.

(21) Appl. No.: 13/052,114

(22) Filed: Mar. 21, 2011

(65) Prior Publication Data

US 2011/0165742 A1 Jul. 7, 2011

Related U.S. Application Data

(62) Division of application No. 11/962,119, filed on Dec. 21, 2007, now Pat. No. 7,939,828.

(30) Foreign Application Priority Data

Apr. 12, 2007 (TW) .................. 96112822 A

(51) Int. Cl.
*H01L 21/00* (2006.01)
*H01L 21/84* (2006.01)

(52) U.S. Cl. ........ 438/159; 438/149; 438/151; 438/155; 438/158; 438/164; 257/59; 257/72; 257/83; 257/E33.064; 257/E33.065; 257/350; 257/E29.117; 349/42; 349/43; 349/46; 216/13; 216/18

(58) Field of Classification Search .................. 438/149, 438/151, 155, 158, 159, 164, 609, 703; 257/59, 257/72, 83, 347, 350, E21.215, E21.219, E21.231, E29.117, E33.064, E33.065; 349/42, 43, 46; 216/13, 18

See application file for complete search history.

(56) References Cited

U.S. PATENT DOCUMENTS

| 7,112,512 B2 * | 9/2006 | Lan et al. ............... 438/430 |
| 2005/0124088 A1 * | 6/2005 | Chen .................... 438/30 |
| 2007/0161160 A1 * | 7/2007 | Chen .................... 438/149 |

* cited by examiner

*Primary Examiner* — Julio J Maldonado
*Assistant Examiner* — Maria Ligai
(74) *Attorney, Agent, or Firm* — Jianq Chyun IP Office

(57) ABSTRACT

A method for fabricating a pixel structure includes providing a substrate having a pixel area. A first metal layer, a gate insulator and a semiconductor layer are formed on the substrate and patterned by using a first half-tone mask or a gray-tone mask to form a transistor pattern, a lower capacitance pattern and a lower circuit pattern. Next, a dielectric layer and an electrode layer both covering the three patterns are sequentially formed and patterned to expose a part of the lower circuit pattern, a part of the lower capacitance pattern and a source/drain region of the transistor pattern. A second metal layer formed on the electrode layer and the electrode layer are patterned by using a second half-tone mask or the gray-tone mask to form an upper circuit pattern, a source/drain pattern and an upper capacitance pattern. A portion of the electrode layer constructs a pixel electrode.

18 Claims, 11 Drawing Sheets

PIXEL STRUCTURE AND METHOD FOR FABRICATING THE SAME

CROSS-REFERENCE TO RELATED APPLICATION

This is a divisional application of and claims the priority benefit of a prior application Ser. No. 11/962,119, filed on Dec. 21, 2007, now allowed. The prior application Ser. No. 11/962,119 claims the priority benefit of Taiwan application serial no. 96112822, filed on Apr. 12, 2007. The entirety of each of the above-mentioned patent applications is hereby incorporated by reference herein and made a part of this specification.

BACKGROUND OF THE INVENTION

1. Field of the Invention

The present invention relates to a method for fabricating a pixel structure, and more particularly to a method for fabricating a pixel structure using a relatively fewer number of masks.

2. Description of Related Art

With the progress of modern visual communication technology, various types of displays have been widely adopted in display screens of consumers' electronic products such as cell phones, notebook computers, digital cameras, and personal digital assistants (PDAs). Among these displays, the liquid crystal display (LCD) and the organic electroluminescence display (OELD) have become the mainstream on the market due to their advantages of lightness, compactness, and lower power-consumption. The manufacturing processes for both the LCD and the OELD include forming a pixel structure arranged in array on a substrate through a semiconductor manufacturing process.

FIGS. 1A through 1G are cross-sectional views depicting a process of fabricating a conventional pixel structure. First, referring to FIG. 1A, a gate 20 is formed on a substrate 10. Next, referring to FIG. 1B, a first dielectric layer 30 is formed on the substrate 10 to cover the gate 20. Thereafter, referring to FIG. 1C, a channel layer 40 is formed on the first dielectric layer 30. Afterwards, referring to FIG. 1D, a source 50 and a drain 60 are formed over the channel layer 40. After that, with reference to FIG. 1E, a second dielectric layer 70 is formed over the substrate 10 to cover the channel layer 40, the source 50 and the drain 60. Next, referring to FIG. 1F, a contact hole H is constructed on the second dielectric layer 70. Afterwards, as shown in FIG. 1G, a pixel electrode 80 is formed on the second dielectric layer 70. A part of the pixel electrode 80 is filled in the contact hole H and is electrically connected to the drain 60. As such, the fabrication of the pixel structure 90 is completed.

To sum up, the fabrication process of the conventional pixel structure 90 is mainly carried out by forming the gate 20 with use of a first mask, forming the channel layer 40 with use of a second mask, forming the source 50 and the drain 60 with use of a third mask, forming the contact hole H with use of a fourth mask, and forming the pixel electrode 80 with use of a fifth mask. Accordingly, the conventional five-mask process of fabricating the pixel structure 90 is rather complicated and time-consuming, which leads to higher possibilities of defects and lower yield of the pixel structure 90. In addition, with the complicated manufacturing process and long time lapse of fabricating the conventional pixel structure 90, the manufacturing costs arisen from the fixed costs of the machines and equipment or the material costs are then increased.

SUMMARY OF THE INVENTION

The present invention is directed to a method for fabricating a pixel structure with use of a relatively fewer number of masks. Said method is adapted to decrease the number of the required masks during the manufacturing process and further to reduce the manufacturing costs.

To embody the present invention, a method for fabricating a pixel structure is provided herein. First, a substrate having a pixel area thereon is provided. Next, a stacked layer constituting a first metal layer, a gate insulator and a semiconductor layer which are sequentially formed on the substrate is constructed. Then, the stacked layer constituting the first metal layer, the gate insulator and the semiconductor layer is patterned by using a first half-tone mask or a gray-tone mask. In other embodiments, the stacked layer may also be patterned through a two-masking process with different exposure dosages. After that, a transistor pattern, a lower capacitance pattern and a lower circuit pattern are formed. The transistor pattern and the lower capacitance pattern include the first metal layer, the gate insulator and the semiconductor layer, respectively, while the lower circuit pattern includes the first metal layer. A material of the gate insulator is, for example, silicon oxide, silicon nitride, or an organic material, while a material of the semiconductor layer is, for example, amorphous silicon or polysilicon. Thereafter, a dielectric layer and an electrode layer are sequentially formed on the substrate. The dielectric layer and the electrode layer cover the transistor pattern, the lower capacitance pattern and the lower circuit pattern. Here, a material of the electrode layer is, for example, a transparent conductive material. Afterwards, the dielectric layer and the electrode layer are patterned to form a patterned dielectric layer and a patterned electrode layer, and thereby a part of the lower circuit pattern, a part of the lower capacitance pattern and a source/drain region of the transistor pattern are exposed. Next, a second metal layer is formed on the electrode layer and is electrically connected to the lower circuit pattern, the lower capacitance pattern and the source/drain region of the transistor pattern. Eternally, the second metal layer and the electrode layer are patterned by using a second half-tone mask or the gray-tone mask to form a patterned second metal layer. It is of certain that the second metal layer may be patterned by the two-masking process with different exposure dosages. Here, after the second metal layer is patterned, an upper circuit pattern, a source/drain pattern and an upper capacitance pattern are formed, and a portion of the patterned electrode layer exposed by the second metal layer in the pixel area is used as a pixel electrode. In view of the foregoing, the pixel structure manufactured through said steps includes a patterned stacked layer disposed on the substrate, the patterned dielectric layer, the patterned electrode layer and the patterned second metal layer.

According to an embodiment of the present invention, the method for fabricating the pixel structure further includes performing an ion doping process on a portion of the semiconductor layer in the lower capacitance pattern and on the semiconductor layer in the source/drain region by using the patterned dielectric layer and the patterned electrode layer as masks after the dielectric layer and the electrode layer are patterned, such that a doped semiconductor layer is formed. Here, the ion doping process is, for example, a P-type ion doping process or an N-type ion doping process.

According to an embodiment of the present invention, the method for fabricating the pixel structure further includes forming a doped semiconductor layer on the electrode layer after the dielectric layer and the electrode layer are patterned, and the doped semiconductor layer is electrically connected to the lower circuit pattern, the lower capacitance pattern and the source/drain region of the transistor pattern, such that the subsequently-formed patterned second metal layer is contacted with other film layers through the doped semiconductor layer. In addition, the doped semiconductor layer is patterned when the second metal layer and the electrode layer are patterned with use of the second half-tone mask or the gray-gone mask, such that the doped semiconductor layer and the second metal layer have identical patterns. In the method for fabricating the pixel structure, the doped semiconductor layer includes a P-type doped semiconductor layer and an N-type doped semiconductor layer.

According to an embodiment of the present invention, the method for fabricating the pixel structure further includes forming a passivation layer on the second metal layer after the second metal layer is formed. Moreover, the passivation layer is patterned when the second metal layer and the electrode layer are patterned with use of the second half-tone mask or the gray-tone mask, such that the passivation layer and the second metal layer have identical patterns. Here, a material of the passivation layer is, for example, silicon oxide, silicon nitride, or an organic material.

According to an embodiment of the present invention, the step of patterning the first metal layer, the gate insulator and the semiconductor layer by using the first half-tone mask or the gray-tone mask includes the following steps. First, a first photoresist layer is formed on the semiconductor layer. Next, a photolithography process is performed on the first photoresist layer by using the first half-tone mask or the gray-tone mask to form a transistor photoresist pattern and a lower capacitance photoresist pattern both having a first thickness in the pixel area and to form a lower circuit photoresist pattern having a second thickness outside the pixel area. Here, the first thickness exceeds the second thickness. An etching process is then performed on the first metal layer, the gate insulator and the semiconductor layer by using the first photoresist layer as a mask, so as to form the lower circuit pattern corresponding to the lower circuit photoresist pattern, the transistor pattern corresponding to the transistor photoresist pattern, and the lower capacitance pattern corresponding to the lower capacitance photoresist pattern. Thereafter, a part of the transistor photoresist pattern in a thickness, a part of the lower capacitance photoresist pattern in a thickness, the lower circuit photoresist pattern and the semiconductor layer in the lower circuit pattern are removed. In other embodiments, the step of removing the lower circuit pattern includes removing the gate insulator. Finally, the remained first photoresist layer is removed.

According to an embodiment of the present invention, the step of patterning the second metal layer and the electrode layer by using the second half-tone mask or the gray-tone mask includes the following steps. First, a second photoresist layer is formed on the second metal layer. Next, a photolithography process is performed on the second photoresist layer by using a second half-tone mask or the gray-tone mask to form an upper circuit photoresist pattern having a third thickness outside the pixel area, and to form a source/drain photoresist pattern having the third thickness, an upper capacitance photoresist pattern having the third thickness, and a pixel electrode photoresist pattern having a fourth thickness in the pixel area. Here, the third thickness exceeds the fourth thickness. Thereafter, an etching process is performed on the second metal layer and the electrode layer by using the second photoresist layer as the mask, so as to form the source/drain pattern corresponding to the source/drain photoresist pattern, the upper capacitance pattern corresponding to the upper capacitance photoresist pattern, and the upper circuit pattern corresponding to the upper circuit photoresist pattern. After that, an ashing process is performed to remove a part of the source/drain photoresist pattern in a thickness, a part of the upper capacitance photoresist pattern in a thickness, a part of the upper circuit photoresist pattern in a thickness and the pixel electrode photoresist pattern. Afterwards, the second metal layer corresponding to the pixel electrode pattern is removed to expose a portion of the electrode layer used as the pixel electrode. Then, the remained second photoresist layer is removed.

According to an embodiment of the present invention, the method for fabricating the pixel structure further includes forming a bonding pad photoresist pattern having the fourth thickness outside the pixel area when the photolithography process is performed on the second photoresist layer by using the second half-tone mask or the gray-tone mask. Then, the ashing process is performed to remove the bonding pad photoresist pattern. Here, the ashing process is, for example, an oxygen plasma ashing process. After that, the second metal layer corresponding to the bonding pad photoresist pattern is removed to form a bonding pad pattern electrically connecting the upper circuit pattern.

The present invention further provides a method for fabricating a pixel structure which is manufactured by similar processes as described above except that the fabrication of areas including the lower circuit pattern and the upper circuit pattern is omitted. In detail, the pixel structure manufactured by said method includes a substrate, a patterned stacked layer, a patterned dielectric layer, a pattern electrode layer and a patterned second metal layer. The patterned stacked layer includes a first metal layer, a gate insulator and a semiconductor layer. In addition, a transistor pattern and a lower capacitance pattern are formed on the substrate. The patterned dielectric layer is disposed on the substrate and covers the transistor pattern and the lower capacitance pattern, and the patterned dielectric layer exposes a part of the lower capacitance pattern and a source/drain region of the transistor pattern. Besides, the patterned electrode layer is disposed on the patterned dielectric layer, and a material of the electrode layer is, for example, a transparent conductive material. In addition, the patterned second metal layer disposed on the patterned electrode layer includes a source/drain pattern and an upper capacitance pattern. The source/drain pattern and the upper capacitance pattern are electrically connected to the source/drain region and the lower capacitance pattern, respectively, and a portion of the patterned electrode layer exposed by the patterned second metal layer is used as a pixel electrode. In other words, the method for fabricating the pixel structure merely includes the manufacture of the transistor pattern, the capacitance pattern and the patterned electrode layer in the pixel area. The fabrication of the circuit pattern outside the pixel area is excluded. As regards the arrangement, the composition and the manufacturing process of each component after the fabrication of the pixel structure is completed are similar to those provided in said method for fabricating said pixel structure, and thus no further description is provided herein.

The present invention further provides a method for fabricating a pixel structure which is manufactured by similar processes as described above except that the fabrication of areas including the upper circuit pattern and the lower circuit pattern and the fabrication of the areas including the upper capacitance pattern and the lower capacitance pattern are omitted. In detail, the pixel structure manufactured by said method includes a substrate, a transistor pattern, a patterned dielectric layer, a pattern electrode layer and a patterned second metal layer. The transistor pattern disposed on the substrate includes a first metal layer, a gate insulator and a semiconductor layer. The patterned dielectric layer is disposed on the substrate and covers the transistor pattern, and the patterned dielectric layer exposes a source/drain region of the transistor pattern. Besides, the patterned electrode layer is disposed on the patterned dielectric layer, and a material of the electrode layer includes a transparent conductive material. Additionally, the patterned second metal layer disposed on the patterned electrode layer includes a source/drain pattern electrically connecting the source/drain region, and a portion of the patterned electrode layer exposed by the patterned second metal layer is used as a pixel electrode. That is to say, the method for fabricating the pixel structure merely includes the manufacture of the transistor pattern and the patterned electrode layer in the pixel area. The fabrication of the capacitance pattern in the pixel area and the fabrication of the circuit pattern outside the pixel area are excluded. As regards the arrangement, the composition and the manufacturing process of each component after the fabrication of the pixel structure is completed are similar to those provided in said method for fabricating said pixel structure, and thus no further description is provided herein.

In comparison with the conventional five-mask manufacturing process, the fabrication process implemented with use of fewer masks in the present invention is not only capable of reducing the costs of the masks, but also able to reduce defects arisen from the complicated manufacturing process. Moreover, in a pixel structure of the present invention, the transistor characterized by a structure having a gate positioned at a bottom thereof can decrease optical currents and maintain performance of the transistor. In addition, a design of an etching stop layer adopted by the transistor can enhance properties of active devices and improve yield of the products.

In order to make the aforementioned and other objects, features and advantages of the present invention more comprehensible, several embodiments accompanied with figures are described in detail below.

DESCRIPTION OF EMBODIMENTS

A pixel structure and a method for fabricating a pixel structure with use of a relatively fewer number of masks are provided in the present invention. The method for fabricating the pixel structure can be employed to manufacture active devices, pixel electrodes and storage capacitance in a pixel area P and to manufacture external circuits outside the pixel area P. Besides, said method may also be utilized to merely fabricate the active devices, the pixel electrodes and the storage capacitance in the pixel area P, or to merely fabricate the active devices and the pixel electrodes in the pixel area P. In the present invention, a pixel structure adapted to use a relatively fewer number of masks is provided in the present invention. However, the area where the pixel structure is fabricated and the area where the fabrication of the pixel structure is completed are not limited in the present invention. Only are the fabrication of the active devices, the pixel electrodes and the storage capacitance in the pixel area P and the fabrication of the external circuits outside the pixel area P are described hereinafter for the convenience of elaboration.

First Embodiment

FIGS. 2A through 2J depict a method for fabricating a pixel structure according to a first embodiment of the present invention.

Figure 1A:
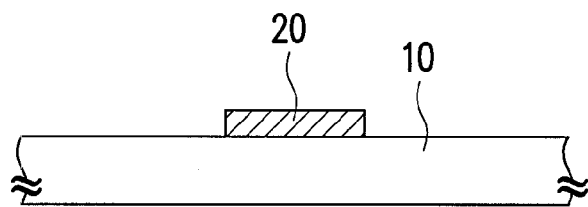
FIGS. 1A through 1G depict a method for fabricating a conventional pixel structure.
Figure 1B:
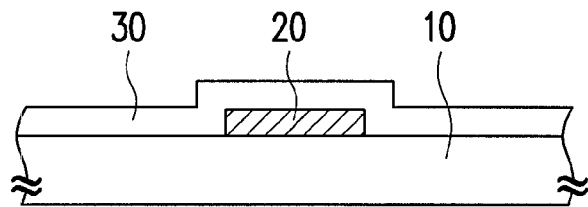
Figure 1C:
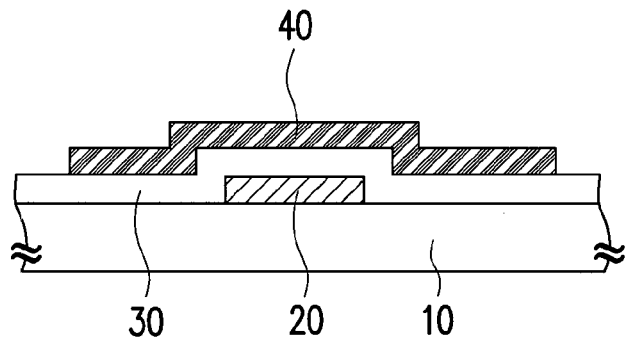
Figure 1D:
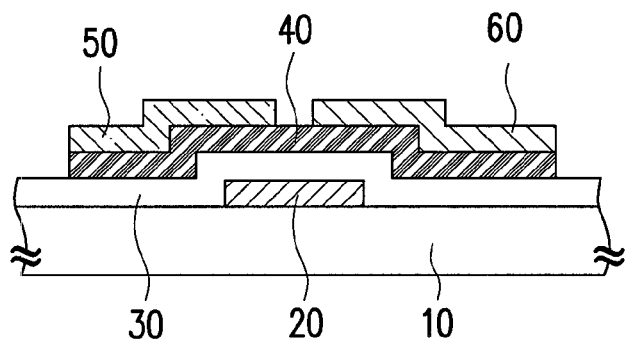
Figure 1E:
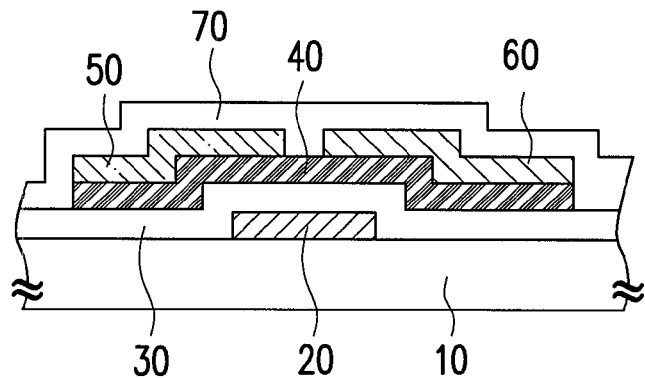
Figure 1F:
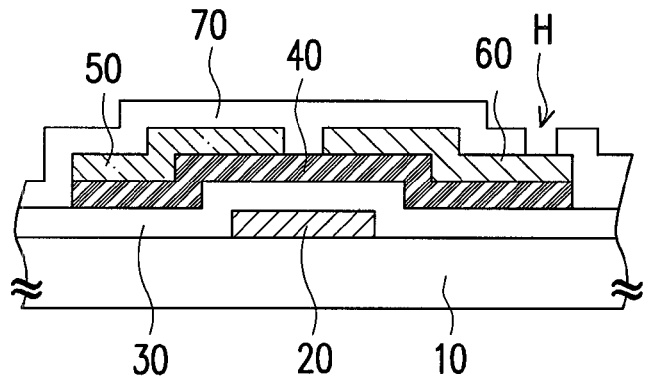
Figure 1G:
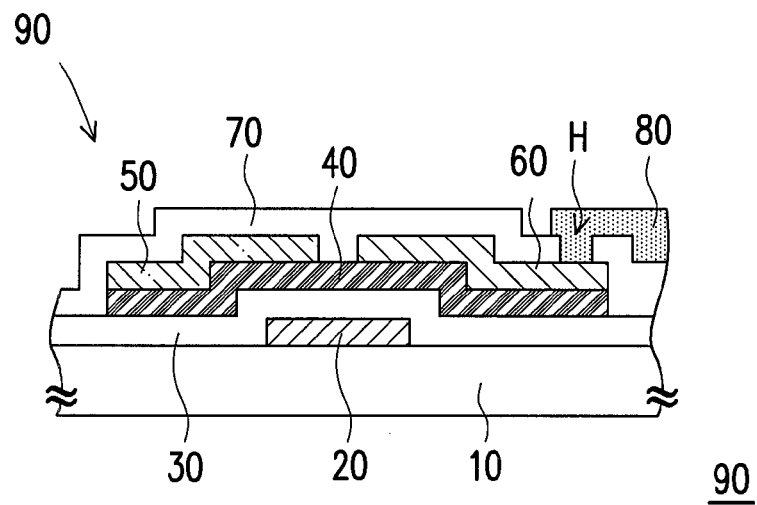
Figure 2A:
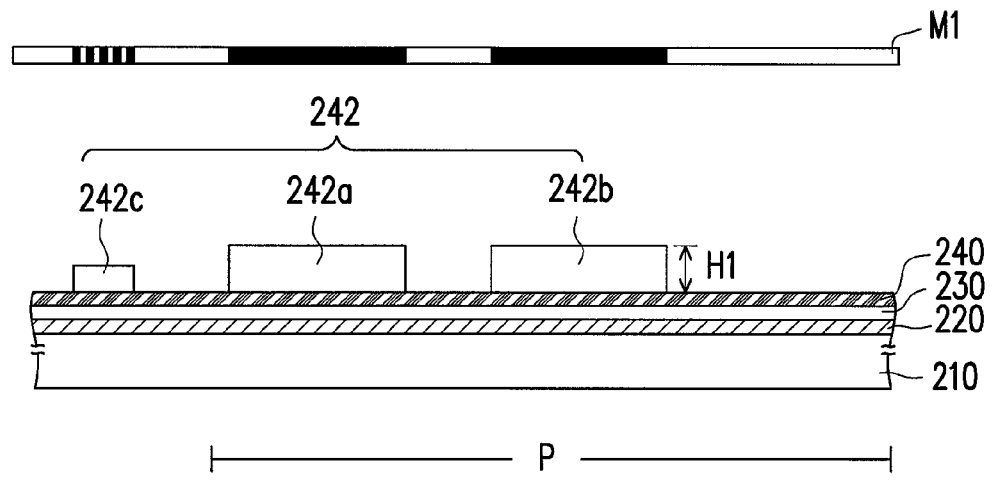
FIGS. 2A through 2J depict a method for fabricating a pixel structure according to a first embodiment of the present invention.

Referring to FIG. 2A first, a substrate 210 having a pixel area P thereon is provided. Next, a first metal layer 220, a gate insulator 230 and a semiconductor layer 240 are sequentially formed on the substrate 210. Here, a material of the semiconductor layer 240 is, for example, amorphous silicon or polysilicon, and the first metal layer 220 is formed by implementing a sputtering process or an evaporation process, for example. In addition, a material of the gate insulator 230 is, for example, silicon oxide, silicon nitride or a stacked layer including both, and the gate insulator 230 is formed by carrying out a chemical vapor deposition (CVD) process. Thereafter, as shown in FIG. 2A, the first metal layer 220, the gate insulator 230 and the semiconductor layer 240 are patterned by using a first half-tone mask or a gray-tone mask M1, so as to form a first photoresist layer 242 on the semiconductor layer 240. Here, the formation of the first photoresist layer 242 includes forming a transistor photoresist pattern 242$a$ and a lower capacitance photoresist pattern 242$b$ both having a first thickness H1 in the pixel area P and forming a lower circuit photoresist pattern 242$c$ having a second thickness H2 outside the pixel area P. The first thickness 111 exceeds the second thickness H2.

Figure 2B:
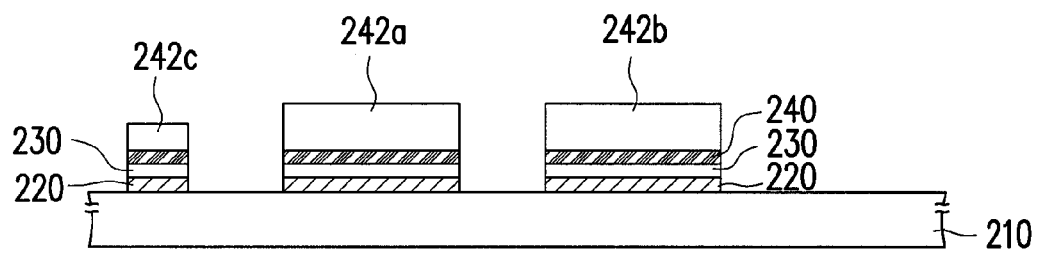

Next, as indicated in FIG. 2B, an etching process is performed on the first metal layer 220, the gate insulator 230 and the semiconductor layer 240 by using the first photoresist layer 242 as a mask. In the present embodiment, the etching process is, for example, a dry etching process, while the etching process may be a wet etching process in other embodiments.

Figure 2C:
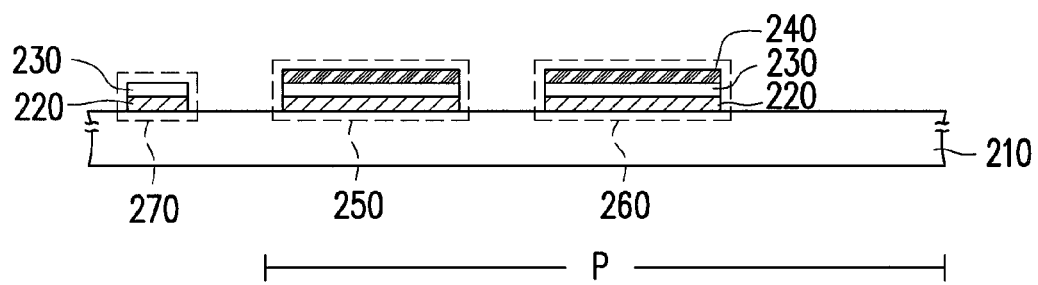

Then, an photoresist removing process is performed, wherein since the first thickness H1 of the transistor photoresist pattern 242$a$ and the lower capacitance photoresist pattern 242$b$ exceeds the second thickness H2 of the lower circuit photoresist pattern 242$c$, the lower circuit photoresist pattern 242$c$ is completely removed after a part of the transistor photoresist pattern 242$a$ in a thickness and a part of the lower capacitance photoresist pattern 242$b$ in a thickness are removed. In the present embodiment, the photoresist is removed by performing an ashing process, for example. Thereafter, as shown in FIG. 2C, the etching process is continuously performed to remove the semiconductor layer 240 corresponding to the removed lower circuit photoresist pattern 242$c$. In other embodiments, the gate insulator 230 may be further removed as removing the semiconductor layer 240. Here, the etching process is the dry etching process, for example. After that, the remained first photoresist layer including the transistor photoresist pattern 242$a$ and the lower capacitance photoresist pattern 242$b$ is removed to form a lower circuit pattern 270 corresponding to the lower circuit photoresist pattern 242$c$, a transistor pattern 250 corresponding to the transistor photoresist pattern 242$a$, and a lower capacitance pattern 260 corresponding to the lower capacitance photoresist pattern 242$b$ (as illustrated in FIG. 2B).

Here, the transistor pattern 250 and the lower capacitance pattern 260 include the first metal layer 220, the gate insulator 230 and the semiconductor layer 240, respectively, and the lower circuit pattern 270 includes the first metal layer 220 and the gate insulator 230 in the present embodiment.

Figure 2D:
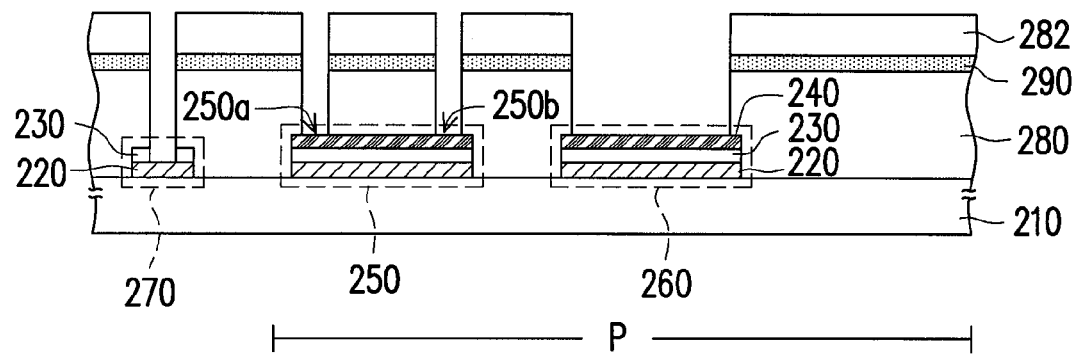

Afterwards, referring to FIG. 2D, a dielectric layer 280 and an electrode layer 290 are sequentially formed on the substrate 210. The dielectric layer 280 and the electrode layer 290 cover the transistor pattern 250, the lower capacitance pattern 260 and the lower circuit pattern 270. A material of the dielectric layer 280 is, for example, silicon nitride, silicon oxide, or a stacked layer including both, and the dielectric layer 280 is formed by performing a physical vapor deposition (PVD) process or the CVD process. On the other hand, the electrode layer 290 is constructed by forming a transparent conductive material layer, such as an ITO layer or an IZO layer through the sputtering process, for example. Next, a photolithography process is performed to form a patterned photoresist layer 282. The etching process is subsequently carried out to etch the dielectric layer 280 and the electrode layer 290 with use of the patterned photoresist layer 282. As shown in FIG. 2D, after the etched dielectric layer 280 and the etched electrode layer 290 are patterned, a part of the lower circuit pattern 270, a part of the lower capacitance pattern 260 and a source 250a/drain 250b of the transistor pattern 250 are exposed.

Figure 2E:
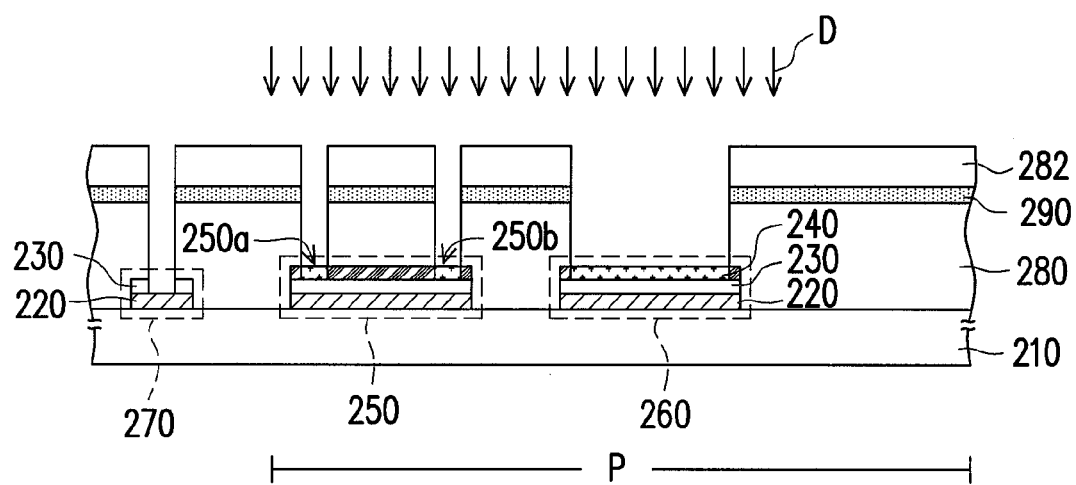

Thereafter, as shown in FIG. 2E, after the dielectric layer 280 and the electrode layer 290 are patterned, an ion doping process D is performed on a portion of the semiconductor layer 240 in the lower capacitance pattern 260 and on the semiconductor layer 240 in the source 250a/drain 250b by using the patterned photoresist layer 282 as the mask. Here, the ion doping process D is, for example, a P-type ion doping process or an N-type ion doping process, and the ion doping process is an ion shower process or an ion implantation process, for example. After that, the patterned photoresist layer 282 is removed. Afterwards, a thermal ion activation process is implemented by using a furnace or performing a rapid thermal process.

Figure 2F:
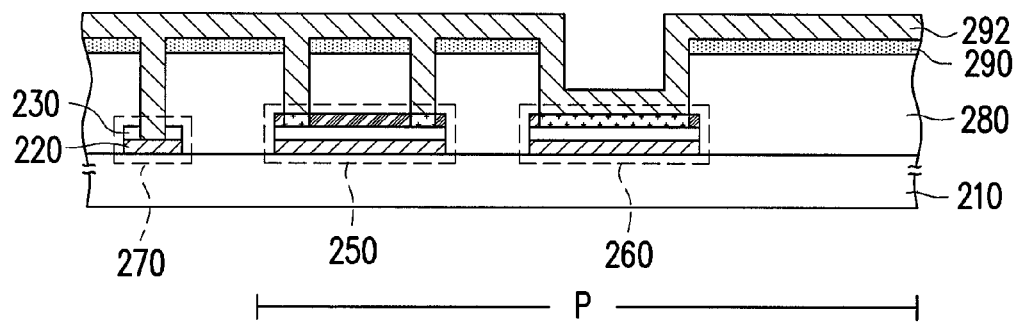
Figure 2G:
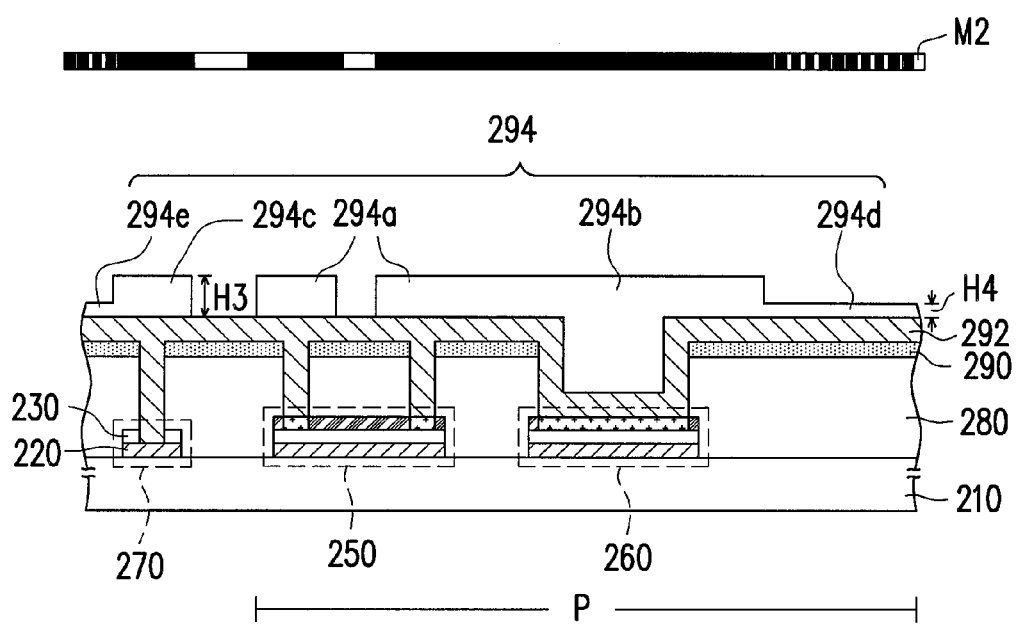

Next, as demonstrated in FIG. 2F, after the ion doping process D is performed, a second metal layer 292 is formed on the electrode layer 290 and is electrically connected to the lower circuit pattern 270, the lower capacitance pattern 260 and the source 250a/drain 250b of the transistor pattern 250. A material of the second metal layer 292 is, for example, aluminum (Al), molybdenum (Mo), molybdenum-niobium (MoN), titanium (Ti), titanium nitride (TiN), a stacked layer including the foregoing, or other conductive materials, and the second metal layer 292 is formed by performing a deposition process through sputtering or evaporation, for example.

Thereafter, the photolithography process is performed by using a second half-tone mask or a gray-tone mask M2 to form a second photoresist layer 294 on the second metal layer 292. The second photoresist layer 294 includes an upper circuit photoresist pattern 294c having a third thickness H3 outside the pixel area P and includes a source/drain photoresist pattern 294a having the third thickness H3, an upper capacitance photoresist pattern 294b having the third thickness H3, and a pixel electrode photoresist pattern 294d having a fourth thickness H4 in the pixel area P. Here, the third thickness H3 exceeds the fourth thickness H4. In the present embodiment, a bonding pad photoresist pattern 294e having the fourth thickness H4 outside the pixel area P is further formed when the photolithography process is performed on the second photoresist layer 294 by using the second half-tone mask or the gray-tone mask M2.

Figure 2H:
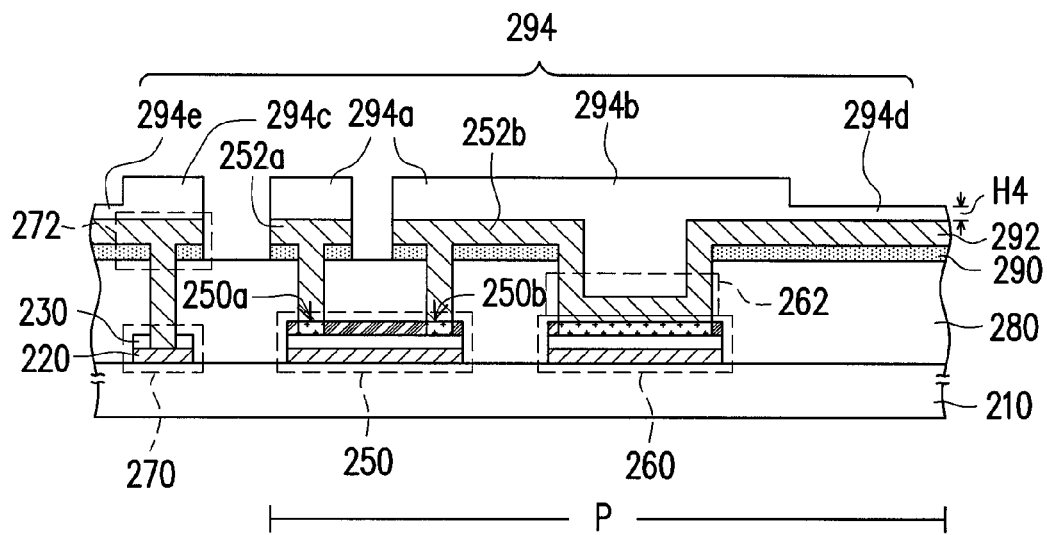

Thereafter, as illustrated in FIG. 2H, an etching process is performed on the second metal layer 292 and the electrode layer 290 by using the second photoresist layer 294 as the mask, so as to form an upper circuit pattern 272 corresponding to the upper circuit photoresist pattern 294c outside the pixel area P and to form a source 252a/drain 252b pattern corresponding to the source/drain photoresist pattern 294a and an upper capacitance pattern 262 corresponding to the upper capacitance photoresist pattern 294b in the pixel area P.

Figure 2I:
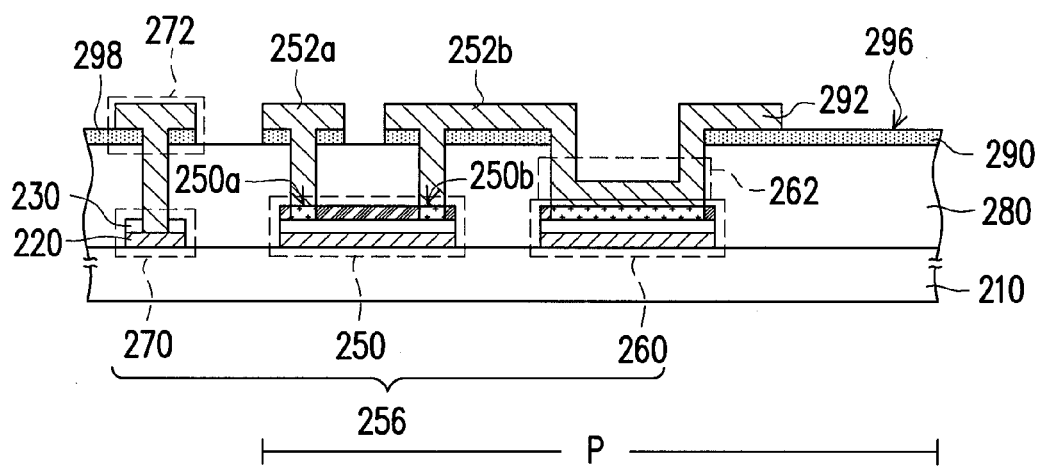

Next, an ashing process is performed. The third thickness H3 of the upper circuit photoresist pattern 294c, the source/drain photoresist pattern 294a and the upper capacitance photoresist pattern 294b exceeds the fourth thickness H4 of the pixel electrode photoresist pattern 294d. Accordingly, as the pixel electrode photoresist pattern 294d is completely removed, only a part of the source/drain photoresist pattern 294a in a thickness, a part of the upper capacitance photoresist pattern 294b and a part of the upper circuit photoresist pattern 294c in a thickness are removed. In the present embodiment, the ashing process is, for example, an oxygen plasma ashing process. After that, the etching process is performed on the second metal layer 292 originally covered by the pixel electrode photoresist pattern 294d, so as to remove the second metal layer 292 corresponding to the pixel electrode photoresist pattern 294d and to expose a portion of the electrode layer 290 used as a pixel electrode 296, as indicated in FIG. 2I. Eternally, the remained second photoresist layer 294 is removed. While the ashing process is performed on the upper circuit photoresist pattern 294c, the source/drain photoresist pattern 294a, the upper capacitance photoresist pattern 294b and the pixel electrode photoresist pattern 294d, removal of the bonding pad photoresist pattern 294e outside the pixel area P is further included. The second metal layer 292 corresponding to the bonding pad photoresist pattern 294e is then removed to form a bonding pad pattern 298.

Figure 2J:
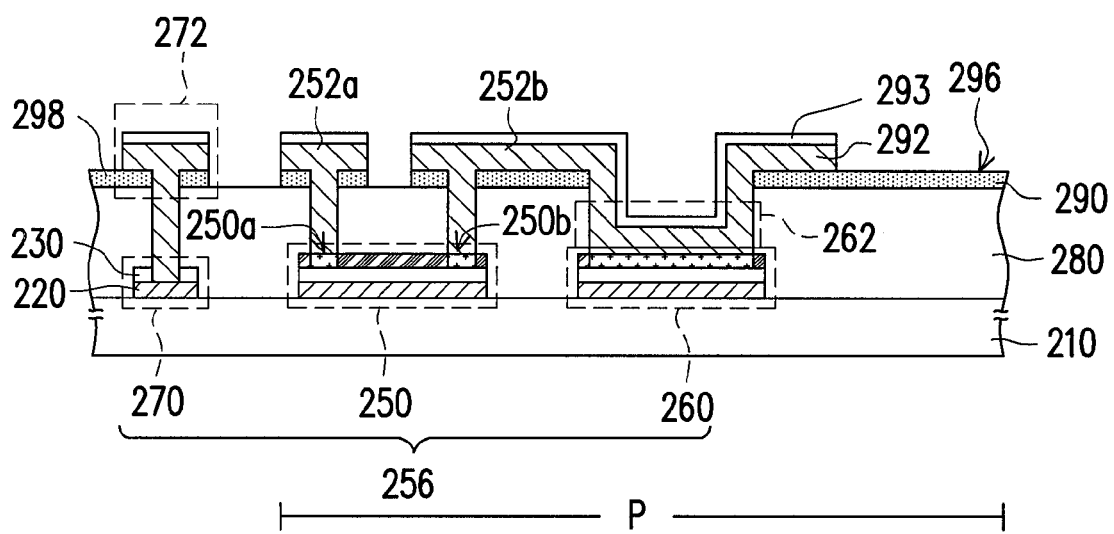

In FIG. 2J, a passivation layer 293 is further formed on the second metal layer 292 after the second metal layer 292 is formed. Moreover, the passivation layer 293 is patterned when the second metal layer 292 and the electrode layer 290 are patterned with use of the second half-tone mask or the gray-tone mask M2, such that the passivation layer 293 and the second metal layer 292 have identical patterns. In the present embodiment, a material of the passivation layer 293 is, for example, silicon nitride, silicon oxide or an organic material, and the passivation layer 293 is formed by performing the PVD process or the CVD process, for example.

Based on the above, the lower circuit pattern 270, the transistor pattern 250 and the lower capacitance pattern 260 are formed with use of the first half-tone mask or the gray-tone mask M1 (as illustrated in FIG. 2C) in said method for fabricating the pixel structure. Another mask is then adopted to perform the patterning process as well as the ion doping process D, such that a part of the lower circuit pattern 270, a part of the lower capacitance pattern 260 and the source 250a/drain 250b of the transistor pattern 250 are exposed (as depicted in FIG. 2E). Thereafter, the fabrication of the pixel structure 200 is completed by using the second half-tone mask or the gray-tone mask M2. In comparison with the conventional five-mask manufacturing process, the method for manufacturing the pixel structure 200 requires fewer masks. Therefore, the manufacturing cost can be reduced, and the defects as a result of the time-consuming manufacturing process can also be minimized.

A pixel structure 200 adapted to be thoroughly fabricated through said steps is also provided. Referring to FIG. 2I, the pixel structure 200 includes the substrate 210, the patterned stacked layer 256, the patterned dielectric layer 280, the patterned electrode layer 290 and the patterned second metal layer 292. Here, the substrate 210 has the pixel area P. The patterned stacked layer 256 is disposed on the substrate 210 and includes the transistor pattern 250 in the pixel area P, the lower capacitance pattern 260 in the pixel area P, and the lower circuit pattern 270 outside the pixel area P. The transistor pattern 250 and the lower capacitance pattern 260 include the first metal layer 220, the gate insulator 230 and the semiconductor layer 240, respectively, and the lower circuit pattern 270 includes the first metal layer 220 and the gate insulator 230. In other embodiments, the lower circuit pattern 270 may merely be composed of the first metal layer 220. The patterned dielectric layer 280 is disposed on the substrate 210 and covers the transistor pattern 250, the lower capacitance pattern 260 and the lower circuit pattern 270. In addition, the patterned dielectric layer 280 exposes a part of the lower circuit pattern 270, a part of the lower capacitance pattern 260 and the source 250a/drain 250b of the transistor pattern 250. The patterned electrode layer 290 is disposed on the patterned dielectric layer 280, and the patterned second metal layer 292 disposed on the patterned electrode layer 290 includes the upper circuit pattern 272, the source 252a/drain 252b pattern and the upper capacitance pattern 262. The upper circuit pattern 272, the source 252a/drain 252b pattern and the upper capacitance pattern 262 are electrically connected to the lower circuit pattern 270, the source 250a/drain 250b and the lower capacitance pattern 260, and a portion of the patterned electrode layer 290 exposed by the patterned second metal layer 292 in the pixel area P is used as the pixel electrode 296. In the present embodiment, the patterned second metal layer 292 outside the pixel area P further exposes a portion of the electrode layer 290 as the bonding pad 298 connecting the upper circuit pattern 272.

Furthermore, in one embodiment of the present invention, the pixel structure 200 may further include the passivation layer 293 disposed on the patterned second metal layer 292, as shown in FIG. 2J. The material of the passivation layer 293 is, for example, silicon oxide, silicon nitride or the organic material.

Second Embodiment

FIGS. 3A through 3I depict a method for fabricating a pixel structure according to a second embodiment of the present invention. The method for fabricating a pixel structure 300 in the present embodiment is similar to that in the first embodiment. In the present embodiment, the method for forming the transistor pattern 250, the lower capacitance pattern 260 and the lower circuit pattern 270 and the method for patterning the dielectric layer 280 and the electrode layer 290 are, as shown in FIGS. 3A-3D, similar to those depicted in FIGS. 2A-2D according to the first embodiment. Therefore, no further description is provided herein.

Figure 3A:
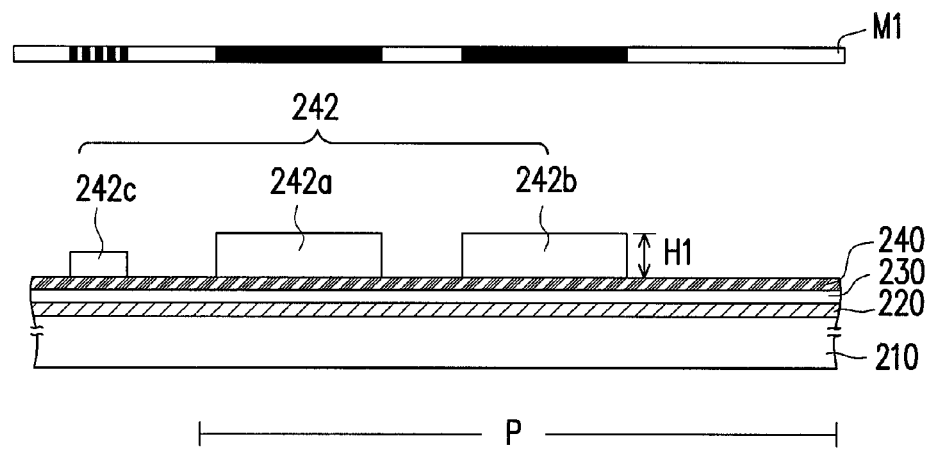
FIGS. 3A through 3I depict a method for fabricating a pixel structure according to a second embodiment of the present invention.
Figure 3B:
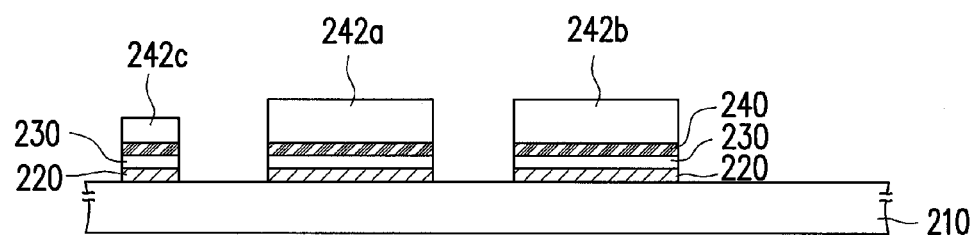
Figure 3C:
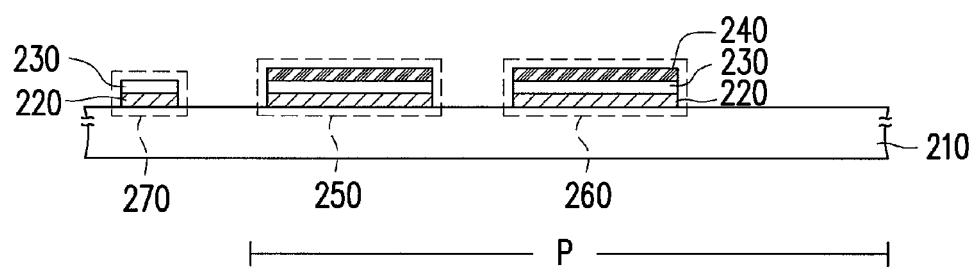
Figure 3D:
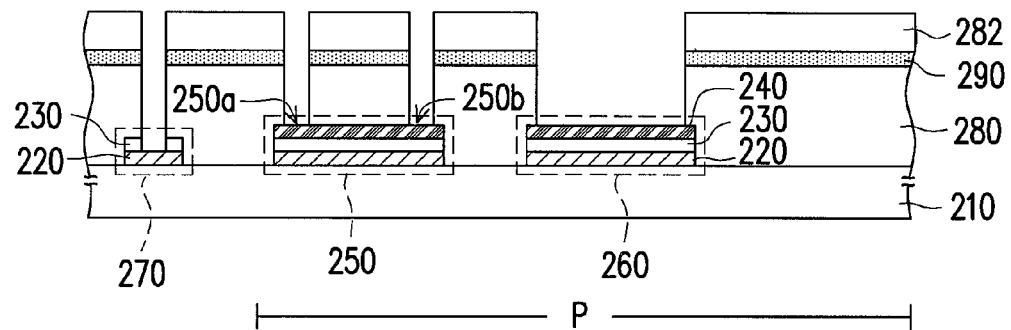
Figure 3E:
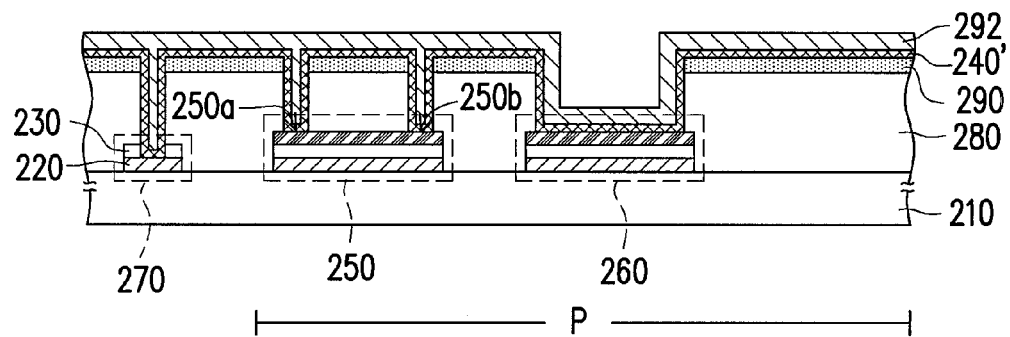
Figure 3F:
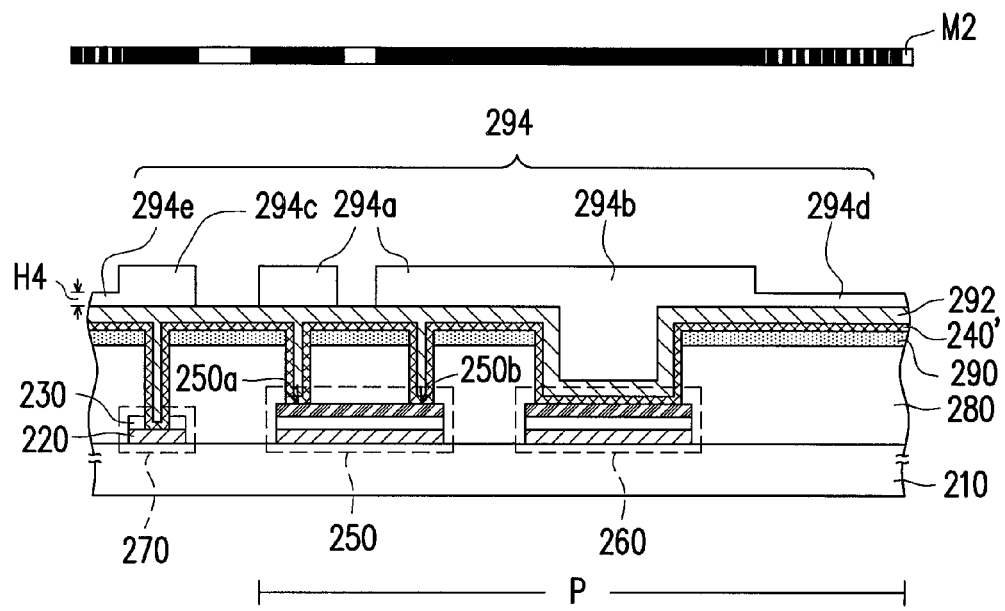
Figure 3G:
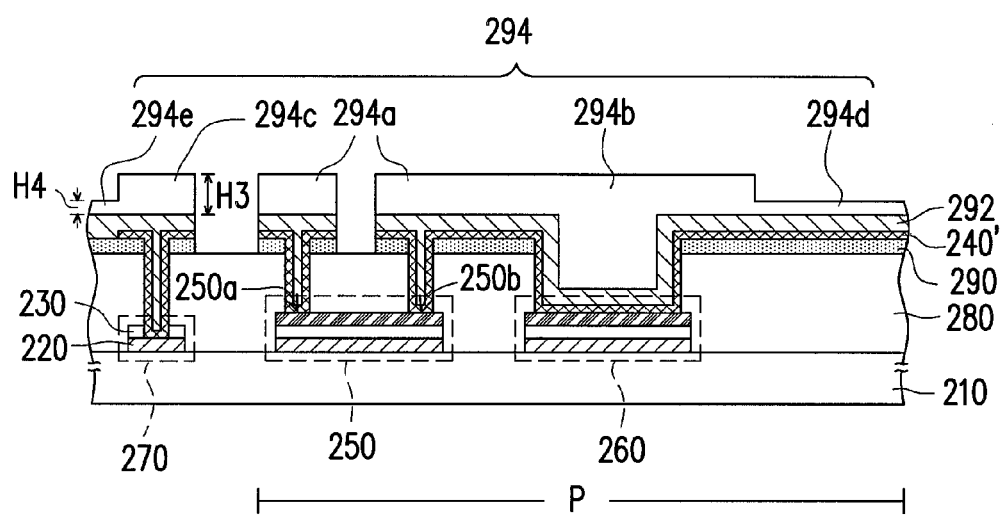

Besides, referring to FIG. 3E, a doped semiconductor layer 240' is formed on the electrode layer 290 after the dielectric layer 280 and the electrode layer 290 are patterned. The doped semiconductor layer 240' is electrically connected to the lower circuit pattern 270, the lower capacitance pattern 260 and the source 250a/drain 250b of the transistor pattern 250. Here, the doped semiconductor layer 240' includes the P-type doped semiconductor layer or the N-type doped semiconductor layer. Next, as demonstrated in FIG. 3F, the photolithography process is performed by using the second half-tone mask or the gray-tone mask M2, so as to form the second photoresist layer 294 similar to that discussed in the first embodiment. Afterwards, as shown in FIG. 3G, the doped semiconductor layer 240' is etched when the etching process is performed on the second metal layer 292 and the electrode layer 290 with use of the second photoresist layer 294 as the mask. The etching process described in the present embodiment may be the dry etching process or the wet etching process.

Figure 3H:
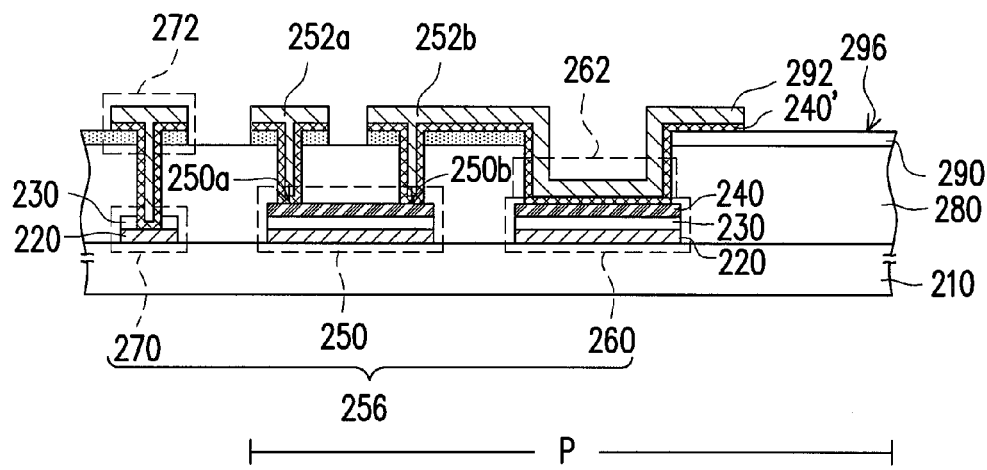

Similar to the first embodiment, the ashing process, the etching process and a photoresist-striping process are performed. Due to different thicknesses of the second photoresist layer 294, the second metal layer 292 corresponding to the pixel electrode photoresist pattern 294d is removed (as depicted in FIG. 3G), exposing a portion of the electrode layer 290 used as the pixel electrode 296, as shown in FIG. 3H. On the other hand, the upper circuit pattern 272 corresponding to the upper circuit photoresist pattern 294c is formed outside the pixel area P, while the source 252a/drain 252b pattern corresponding to the source/drain photoresist pattern 294a (as depicted in FIG. 3G) and the upper capacitance pattern 262 corresponding to the upper capacitance photoresist pattern 294b (as depicted in FIG. 3G) are formed in the pixel area P.

Figure 3I:
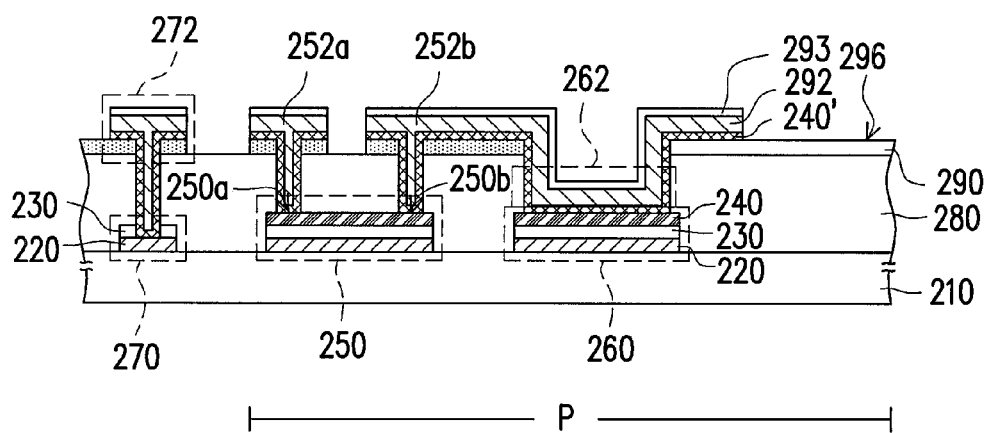

Similar to FIG. 2J of the first embodiment, FIG. 3I depicts a formation of the passivation layer 293 on the second metal layer 292 after the second metal layer 292 is formed. Thus, no further description is provided herein.

Please refer to FIG. 3H. In view of the foregoing, the present invention provides the pixel structure 300 adapted to be thoroughly fabricated through said steps. The pixel structure 300 and the pixel structure 200 are alike, while the pixel structure 300 further includes the doped semiconductor layer 240' disposed at a bottom of the patterned second metal layer 292, such that the patterned second metal layer 292 is contacted with other film layers through the doped semiconductor layer 240'. Here, the doped semiconductor layer 240' is, for example, the P-type doped semiconductor layer or the N-type doped semiconductor layer, and the doped semiconductor layer 240' is formed by performing the PVD process or the CVD process. Furthermore, the pixel structure 300 may further include the passivation layer 293 disposed on the patterned second metal layer 292, as shown in FIG. 2J. The material of the passivation layer 293 is, for example, silicon oxide, silicon nitride or the organic material.

To sum up, the method for fabricating the pixel structure in the present invention is implemented by employing a relatively fewer number of the masks. Thus, in comparison with the conventional five-mask manufacturing process, the manufacturing costs can be reduced to a great extent, and yield of the pixel structure can be improved. Additionally, the method for fabricating the pixel structure according to the present invention is implemented by using the half-tone mask or the gray-tone mask which is equipped with capability for mass production. As such, the present invention has the advantage of high feasibility of mass production. Moreover, the half-tone mask or the gray-tone mask can be replaced by utilizing two masks with different exposure dosages. The types of the masks are not limited in the present invention. Further, in the pixel structure of the present invention, the transistor having a gate positioned at a bottom thereof can minimize the negative impact arisen from backlights on the transistor, reduce the optical currents, and further maintain performance of the transistor. In addition, a design of an etching stop layer adopted by the transistor can enhance properties of the active devices and improve yield of the products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pixel structure, comprising:
providing a substrate, wherein the substrate has a pixel area;
forming a first metal layer, a gate insulator and a semiconductor layer on the substrate sequentially;
patterning the first metal layer, the gate insulator and the semiconductor layer to form a transistor pattern, a lower capacitance pattern and a lower circuit pattern, wherein the transistor pattern and the lower capacitance pattern comprise the first metal layer, the gate insulator and the semiconductor layer, respectively, and the lower circuit pattern comprises the first metal layer;
forming a dielectric layer and an electrode layer sequentially on the substrate, wherein the dielectric layer and the electrode layer cover the transistor pattern, the lower capacitance pattern and the lower circuit pattern;
patterning the dielectric layer and the electrode layer to expose a part of the lower circuit pattern, a part of the lower capacitance pattern and a source/drain region of the transistor pattern;
forming a second metal layer on the electrode layer and electrically connecting the second metal layer to the lower circuit pattern, the lower capacitance pattern and the source/drain region of the transistor pattern; and
patterning the second metal layer and the electrode layer to form an upper circuit pattern, a source/drain pattern and an upper capacitance pattern, wherein a portion of the electrode layer exposed by the second metal layer in the pixel area is used as a pixel electrode, and the patterned second metal layer outside the pixel area further exposes a portion of the electrode layer used as a bonding pad, the bonding pad electrically connecting the upper circuit pattern.

2. The method for fabricating the pixel structure as claimed in claim 1, further comprising performing an ion doping process on a portion of the semiconductor layer in the lower capacitance pattern and on the semiconductor layer in the source/drain region by using the patterned dielectric layer and the patterned electrode layer as masks after the dielectric layer and the electrode layer are patterned.

3. The method for fabricating the pixel structure as claimed in claim 2, wherein the ion doping process comprises a P-type ion doping process or an N-type ion doping process.

4. The method for fabricating the pixel structure as claimed in claim 1, wherein the step of patterning the first metal layer, the gate insulator and the semiconductor layer is performed through a half-tone masking process, a gray-tone masking process or a two-masking process with different exposure dosages.

5. The method for fabricating the pixel structure as claimed in claim 1, wherein the step of patterning the second metal layer and the electrode layer is performed through a half-tone masking process, a gray-tone masking process or a two-masking processes with different exposure dosages.

6. The method for fabricating the pixel structure as claimed in claim 1, further comprising:
forming a doped semiconductor layer on the electrode layer after the dielectric layer and the electrode layer are patterned, and electrically connecting the doped semiconductor layer to the lower circuit pattern, the lower capacitance pattern and the source/drain region of the transistor pattern; and
patterning the doped semiconductor layer when the second metal layer and the electrode layer are patterned, such that the doped semiconductor layer and the second metal layer have identical patterns.

7. The method for fabricating the pixel structure as claimed in claim 1, further comprising:
forming a passivation layer on the second metal layer after the second metal layer is formed; and
patterning the passivation layer when the second metal layer and the electrode layer are patterned, such that the passivation layer and the second metal layer have identical patterns.

8. The method for fabricating the pixel structure as claimed in claim 1, wherein the step of patterning the first metal layer, the gate insulator and the semiconductor layer comprises:
forming a first photoresist layer on the semiconductor layer;
performing a photolithography process on the first photoresist layer by using a first half-tone mask to form a transistor photoresist pattern and a lower capacitance photoresist pattern both having a first thickness in the pixel area and to form a lower circuit photoresist pattern having a second thickness outside the pixel area, the first thickness exceeding the second thickness;
performing an etching process on the first metal layer, the gate insulator and the semiconductor layer by using the first photoresist layer as a mask, so as to form the lower circuit pattern corresponding to the lower circuit photoresist pattern, the transistor pattern corresponding to the transistor photoresist pattern, and the lower capacitance pattern corresponding to the lower capacitance photoresist pattern;
removing a part of the transistor photoresist pattern in a thickness, a part of the lower capacitance photoresist pattern in a thickness, the lower circuit photoresist pattern and the semiconductor layer in the lower circuit pattern; and
removing the remained first photoresist layer.

9. The method for fabricating the pixel structure as claimed in claim 8, further comprising removing the gate insulator in the lower circuit pattern.

10. The method for fabricating the pixel structure as claimed in claim 1, wherein the step of patterning the second metal layer and the electrode layer comprises:
forming a second photoresist layer on the second metal layer;
performing a photolithography process on the second photoresist layer by using a second half-tone mask to form an upper circuit photoresist pattern having a third thickness outside the pixel area, and to form a source/drain photoresist pattern having the third thickness, an upper capacitance photoresist pattern having the third thickness, and a pixel electrode photoresist pattern having a fourth thickness in the pixel area, the third thickness exceeding the fourth thickness;
performing an etching process on the second metal layer and the electrode layer by using the second photoresist layer as a mask, so as to form the source/drain pattern corresponding to the source/drain photoresist pattern, the upper capacitance pattern corresponding to the upper capacitance photoresist pattern, and the upper circuit pattern corresponding to the upper circuit photoresist pattern;
performing an asphing process to remove a part of the source/drain photoresist pattern in a thickness, a part of the upper capacitance photoresist pattern in a thickness, a part of the upper circuit photoresist pattern in a thickness and the pixel electrode photoresist pattern;
removing the second metal layer corresponding to the pixel electrode photoresist pattern to expose a portion of the electrode layer used as the pixel electrode; and removing the remained second photoresist layer.

11. The method for fabricating the pixel structure as claimed in claim 10, further comprising:
forming a bonding pad photoresist pattern having the fourth thickness outside the pixel area when the photolithography process is performed on the second photoresist layer by using the second half-tone mask;
performing the ashing process to remove the bonding pad photoresist pattern; and
removing the second metal layer corresponding to the bonding pad photoresist pattern to form a bonding pad pattern.

12. A method for fabricating a pixel structure, comprising:
providing a substrate having a pixel area thereon;
forming a first metal layer, a gate insulator and a semiconductor layer on the substrate sequentially;
patterning the first metal layer, the gate insulator and the semiconductor layer to form a transistor pattern and a lower capacitance pattern on the substrate;
forming a dielectric layer and an electrode layer on the substrate to cover the transistor pattern and the lower capacitance pattern;
patterning the dielectric layer and the electrode layer to expose a part of the lower capacitance pattern and a source/drain region of the transistor pattern;
forming a second metal layer on the electrode layer and electrically connecting the second metal layer to the lower capacitance pattern and the source/drain region of the transistor pattern; and
patterning the second metal layer and the electrode layer to form a source/drain pattern and an upper capacitance pattern, wherein a portion of the electrode layer exposed by the second metal layer in the pixel area is used as a pixel electrode, the patterned second metal layer outside the pixel area further exposes a portion of the electrode layer used as a bonding pad, and the source/drain pattern and the upper capacitance pattern are electrically connected to the source/drain region and the lower capacitance pattern, respectively.

13. The method for fabricating the pixel structure as claimed in claim 12, wherein the step of patterning the second metal layer and the electrode layer is performed through a half-tone masking process, a gray-tone masking process or a two-masking process with different exposure dosages.

14. The method for fabricating the pixel structure as claimed in claim 12, further comprising performing an ion doping process on a portion of the semiconductor layer in the lower capacitance pattern and on the semiconductor layer in the source/drain region by using the patterned dielectric layer and the patterned electrode layer as masks after the dielectric layer and the electrode layer are patterned.

15. The method for fabricating the pixel structure as claimed in claim 14, wherein the ion doping process comprises a P-type ion doping process or an N-type ion doping process.

16. The method for fabricating the pixel structure as claimed in claim 12, further comprising:
forming a doped semiconductor layer on the electrode layer after the dielectric layer and the electrode layer are patterned, and electrically connecting the doped semiconductor layer to the lower capacitance pattern and the source/drain region of the transistor pattern; and
patterning the doped semiconductor layer when the second metal layer and the electrode layer are patterned, such that the doped semiconductor layer and the second metal layer have identical patterns.

17. The method for fabricating the pixel structure as claimed in claim 12, further comprising:
forming a passivation layer on the second metal layer after the second metal layer is formed; and
patterning the passivation layer when the second metal layer and the electrode layer are patterned, such that the passivation layer and the second metal layer have identical patterns.

18. The method for fabricating the pixel structure as claimed in claim 12, wherein the step of patterning the second metal layer and the electrode layer comprises:
forming a photoresist layer on the second metal layer;
performing a photolithography process on the photoresist layer with use of a half-tone mask to form a source/drain photoresist pattern and an upper capacitance photoresist pattern both having a first thickness and to form a pixel electrode photoresist pattern having a second thickness, the first thickness exceeding the second thickness;
performing an etching process on the second metal layer and the electrode layer by using the photoresist layer as a mask, so as to form the source/drain pattern corresponding to the source/drain photoresist pattern and the upper capacitance pattern corresponding to the upper capacitance photoresist pattern;
performing an ashing process to remove a part of the source/drain photoresist pattern in a thickness, a part of the upper capacitance photoresist pattern in a thickness and the pixel electrode photoresist pattern;
removing the second metal layer corresponding to the pixel electrode photoresist pattern to expose a portion of the electrode layer used as the pixel electrode; and
removing the remained photoresist layer.

* * * * *